United States Patent

Takamatsu et al.

[11] Patent Number: 6,106,898
[45] Date of Patent: Aug. 22, 2000

[54] PROCESS FOR PREPARING NITRIDE FILM

[75] Inventors: Yukichi Takamatsu; Takeo Yoneyama; Yoshiyasu Ishihama, all of Kanagawa-ken, Japan

[73] Assignee: Japan Pionics, Co., Ltd., Tokyo, Japan

[21] Appl. No.: 09/159,092

[22] Filed: Sep. 23, 1998

[30] Foreign Application Priority Data

Nov. 28, 1997 [JP] Japan .................................. 9-344183

[51] Int. Cl.⁷ .................................................. C23C 16/34
[52] U.S. Cl. ............................. 427/255.21; 427/255.26; 427/255.391; 427/255.394; 427/255.4
[58] Field of Search ................... 427/255.21, 255.26, 427/255.394, 255.391, 255.4

[56] References Cited

FOREIGN PATENT DOCUMENTS 0 896 406  2/1999  European Pat. Off. .
43 42 730  6/1995  Germany .

OTHER PUBLICATIONS

Patent Abstract of Japan, vol. 1998, Oct. 31, 1998, JP 10 190135, Jul. 21, 1998.
Derwent Publications Ltd., Derwent Abstracts, AN 1998–129551, JP 63 072661, Apr. 2, 1988.
Nishide et al., Journal of Crystal Growth, vol. 189–190, pp. 325–329, Jun., 1998.
Shuichi Nishide, et al., Journal of Crystal Growth, vol. 189–190, pp. 325–329, "Study of the Pyrolysis of Tertiar-butylhydrazine and GaN Film", Jun. 1998.
Patent Abstracts of Japan, vol. 098, No. 012, Oct. 31, 1998 JP 10 182575, Jul. 7, 1998.
Patent Abstracts of Japan, vol. 095, No. 010, Nov. 30, 1995, JP 07 180058, Jul. 18, 1995.
Derwent Abstracts, AN 85–108095, JP 60 052578, Mar. 25, 1985.
Database WPI, Derwent Publications, AN 1995–334208, JP 07–230991, Aug. 29, 1995.
Y. Kasai, et al., Extended Abstracts of The Japan Society of Applied Physics, No. 2, p. 607, "Measurement of Vapor Pressure of TBH, $(CH_3)_3$:Low–Poisonous Nitrogen Source for CVD", Oct. 1997 (with English Translation).

*Primary Examiner*—Timothy Meeks
*Attorney, Agent, or Firm*—Oblon, Spivak, McClelland, Maier & Neustadt, P.C.

[57] ABSTRACT

A process for preparing a nitride film by a chemical vapor deposition method, which entails reacting a material gas including tert-butyl hydrazene as the main component as the main component of a nitrogen source with a material gas of an organometallic compound, a metal halide or a metal hydride to deposit the nitride film on a substrate.

10 Claims, 2 Drawing Sheets

PROCESS FOR PREPARING NITRIDE FILM

BACKGROUND OF THE INVENTION (1). Field of the Invention

The present invention relates to a process for preparing a nitride film present in various semiconductors, and more specifically, it relates to a process for preparing a nitride film by a chemical vapor deposition method or the like. The chemical vapor deposition method (the CVD method) is a technique which comprises feeding a raw material in a gaseous state, and then carrying out a chemical reaction in a vapor phase or on the surface of a substrate to deposit a thin film thereon. According to this method, the formation of various thin films is possible in a range wider than other deposition methods such as a vacuum vapor deposition method and a sputtering method, and for this reason, the chemical vapor deposition method is used to manufacture semiconductor films, insulating films, metallic films and the like which are necessary for the manufacture of semiconductor devices.

(2). Description of the Prior Art

In a chemical vapor deposition method, a material gas is selected in accordance with a kind of thin film to be deposited, but in general, there can be used a material which is gaseous at ordinary temperature as well as a liquid and a solid material having a sufficiently high vapor pressure. In practice, a material which is easily available in a high-purity state and free from toxicity and the danger of explosion is selected, and for the purposes of improving the quality of the thin film, lowering a deposition temperature and accelerating a deposition speed, novel material gases have been developed.

Heretofore, as the material gases which are nitrogen sources for use in the manufacture of the nitride film by the chemical vapor deposition method, there can usually be used ammonia, hydrazine ($NH_2NH_2$), monomethylhydrazine ($CH_3NHNH_2$) and dimethylhydrazines [$(CH_3)_2NNH_2$ and $(CH_3)NHNH(CH_3)$]. In addition, as another material gas which can react with the material gas as the nitrogen source to form the nitride film, there can be used compounds of silicon, titanium, aluminum, tantalum, tungsten and the like. Typical examples of a technique for manufacturing the nitride film include a high-temperature thermal CVD method, a plasma CVD method and a photo assisted CVD method, and a suitable manufacturing method is selected from them in consideration of a use purpose of the nitride film.

As an example in which ammonia is used as the material gas of the nitrogen source, a method is well known which comprises reacting the ammonia gas with a gas of silicon hydride or a gas of silicon halide to from a silicon nitride film. According to this manufacturing method, an $Si_3N_4$ film having an excellent crystallinity can be formed. However, since ammonia has a high decomposition temperature, the deposition temperature of the nitride film is as high as about 1000° C., so that the escape of nitrogen from the deposited nitride film or a lamination defect in the nitride film tends to occur. In addition, it is impossible to do wiring on a substrate by the use of a metal having a low melting point such as aluminum, and it is also impossible to deposit the nitride film on the substrate which cannot withstand a high temperature.

In the plasma CVD method, since the reaction takes place in a plasma state having a high energy, the deposition temperature of the nitride film can be set to about 400° C., which permits the remarkable drop of the deposition temperature. In this case, however, the composition of the nitride film is such as to be represented by $Si_xN_y$, so that the denseness of the nitride film is lower than that of the nitride film manufactured by the high-temperature thermal CVD method. Moreover, also in the case of the photo assisted CVD method, radicals which contribute to the reaction are produced by light irradiation, and therefore the drop of the deposition temperature is possible, but similarly to the plasma CVD method, the deterioration of the denseness of the nitride film cannot be avoided.

Furthermore, as an example using the chemical vapor deposition method, there is a method in which a GaN-containing compound semiconductor is manufactured by a reaction of ammonia with an alkyl compound of gallium or the like. However, since the decomposability of ammonia is low, a high V/III ratio of 1000 to 20000 (a ratio of mols of nitrogen in the group V of the periodic table/mols of a metal in the group III thereof) and a high nitride film deposition temperature of about 1000° C. are required. In consequence, the escape of nitrogen is liable to occur, or there is a problem that, for example, an element In is scarcely introduced into the deposited layer during the deposition of an InGaN film.

In recent years, it has been investigated to use hydrazine, monomethylhydrazine and dimethylhydrazines as the nitrogen source gases for the manufacture of the nitride film. These compounds are liquid at ordinary temperature, but they have a sufficiently high vapor pressure and hold an N—N bond in the molecule which is decomposable at a lower energy than an N—H bond. Therefore, they have characteristics that the N—N bond is cleaved at a temperature lower than the decomposition temperature of ammonia and hence the decomposition occurs. Accordingly, in the case that any of these compounds is used as the material gas of the nitrogen source, the nitride film can be deposited even at a nitride film deposition temperature of about 500° C., and therefore the manufacture of the nitride film is possible even at a temperature of about 500° C. In addition, the nitride film having a satisfactory quality can be obtained.

However, hydrazine and monomethylhydrazine are recognized to have a variant which induces a mutation of a gene, and dimethylhydrazines also have characteristics that a TLV (an allowable concentration) regulated by ACGIH is very low. Thus, with regard to these compounds, much attention has been paid to their extremely high toxicity.

On the other hand, in addition to the above-mentioned chemical vapor deposition method, another technique for preparing the nitride film is known and utilized. For example, a silicon substrate can be held at a high temperature in the material gas atmosphere of a nitrogen source such as ammonia or hydrazine to directly nitride Si, thereby forming an SiN layer on the surface of the silicon substrate. Similarly, it is also possible to form an SiON layer on the surface of an $SiO_2$ substrate by the use of ammonia, hydrazine or the like. In any of the above-mentioned methods, however, the problems of the toxicity, the vapor pressure and the decomposition properties regarding the material gas of the nitrogen source cannot be avoided.

SUMMARY OF THE INVENTION

An object of the present invention is to provide a process for preparing, by a chemical vapor deposition method or the like, a nitride film in which the enhancement of a thin film quality, the drop of a deposition temperature and the acceleration of a deposition speed are realized by developing a material gas of a nitrogen source which is less toxic, has a sufficiently high vapor pressure and can be decomposed at a relatively low temperature.

The first aspect of the present invention is directed to a process for preparing a nitride film by a chemical vapor deposition method which comprises the step of reacting a material gas including tert-butylhydrazine as the main component of a nitrogen source with a material gas of an organometallic compound, a metal halide or a metal hydride to deposit the nitride film on a substrate.

The second aspect of the present invention is directed to a process for preparing a nitride film which comprises the step of nitriding the surface of a substrate comprising a metal or a metal oxide by the use of a material gas including tert-butylhydrazine as the main component of a nitrogen source.

Tert-butylhydrazine which can be used in the present invention is not commercially available in the form of a simple substance, but it is on the market as a hydrochloride of tert-butylhydrazine in a crystalline state. Furthermore, this compound is only used as a constitutional component of agricultural chemicals or a catalyst for organic syntheses. It is understood that the hydrochloride of tert-butylhydrazine does not have such a vapor pressure as required in a CVD method and hydrochloric acid which is an adduct might bring about an etching function. Therefore, the hydrochloride of tert-butylhydrazine has not been considered at all to be suitable for a material for use in the CVD method. The present invention has been attained by establishing a technique of removing hydrochloric acid from the hydrochloride of tert-butylhydrazine to liquefy the same, and then heightening the purity of tert-butylhydrazine.

In the present invention, tert-butylhydrazine has been evaluated by an Ames test (a variant test), and it has been confirmed that the results of the test are negative. Accordingly, it has been grasped that tert-butylhydrazine is less toxic as compared with hydrazine, monomethylhydrazine and dimethylhydrazines. Furthermore, a vapor pressure of tert-butylhydrazine has been measured, and as a result, the number of molecules in a vapor phase has increased by decomposition at temperatures of about 200° C. or more, as shown in FIG. 2, whereby a pressure rise has been observed. Incidentally, in FIG. 2, the increase in the vapor pressure at 10 to 50° C. is due to the gasification of tert-butylhydrazine, and the increase in the vapor pressure at 50 to 200° C. is due to the expansion of tert-butylhydrazine. In addition, conversions of tert-butylhydrazine at temperatures have been compared with those of ammonia, and as a result, the decomposition temperatures of tert-butylhydrazine are much lower than those of ammonia, as shown in FIG. 3. Thus, it has been confirmed that tert-butylhydrazine has the convenient vapor pressure and decomposition properties as the material gas of the nitrogen source.

That is to say, the present inventors have intensively investigated with the intention of solving the above-mentioned problems, and as a result, it has been found that tert-butylhydrazine, whose hydrochloride alone is known to be effective in the fields of the manufacture of agricultural chemicals and the organic syntheses, has the low toxicity, the good vapor pressure properties and the low-temperature decomposition properties. Furthermore, a technique of purifying tert-butylhydrazine up to an extremely high purity has been established, and in consequence, the present invention has been attained.

EXPLANATION OF SYMBOLS

Figure 1:
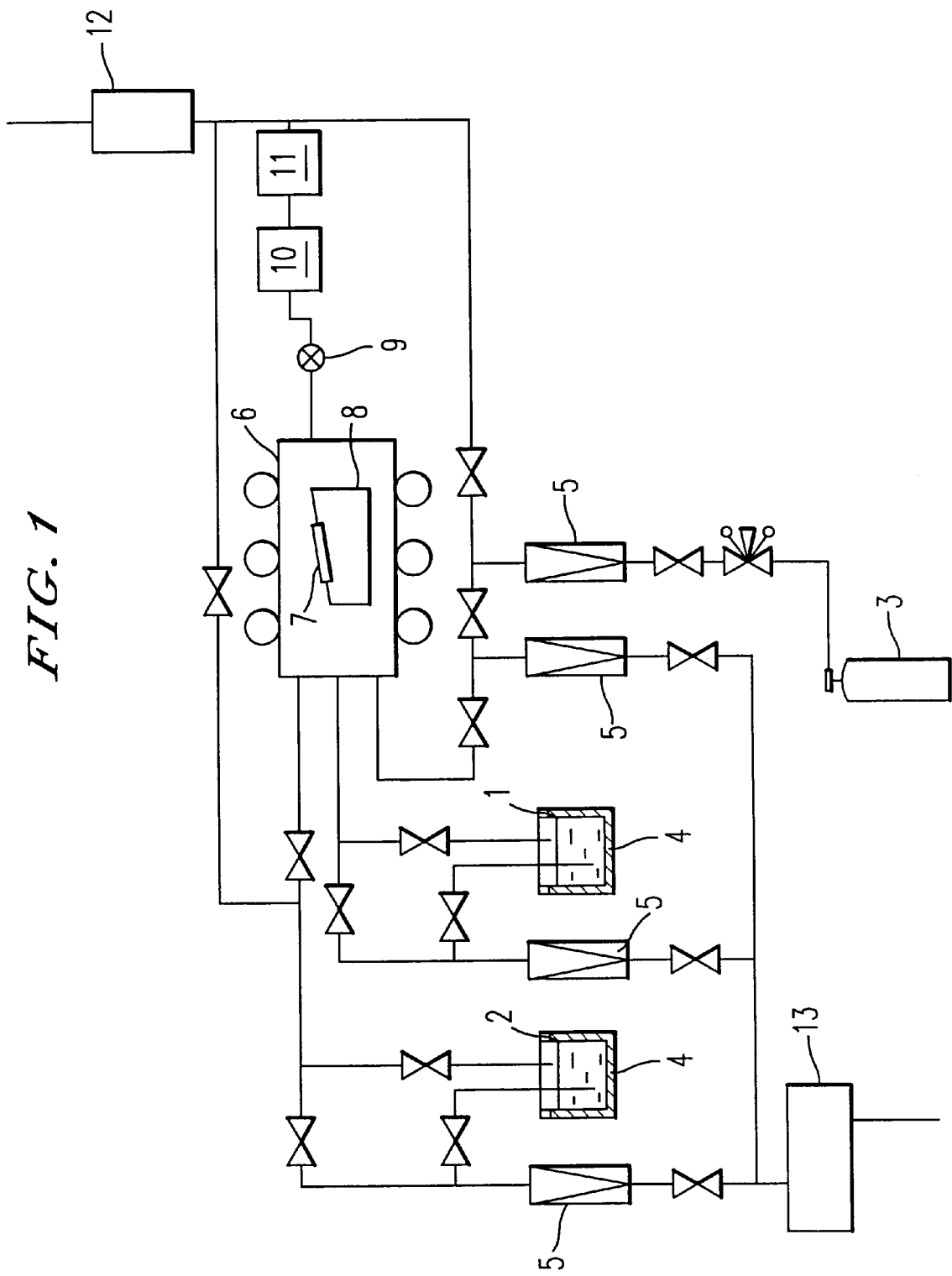
FIG. 1 shows a vapor phase growth device for performing a process for preparing a nitride film of the present invention.
Figure 2:
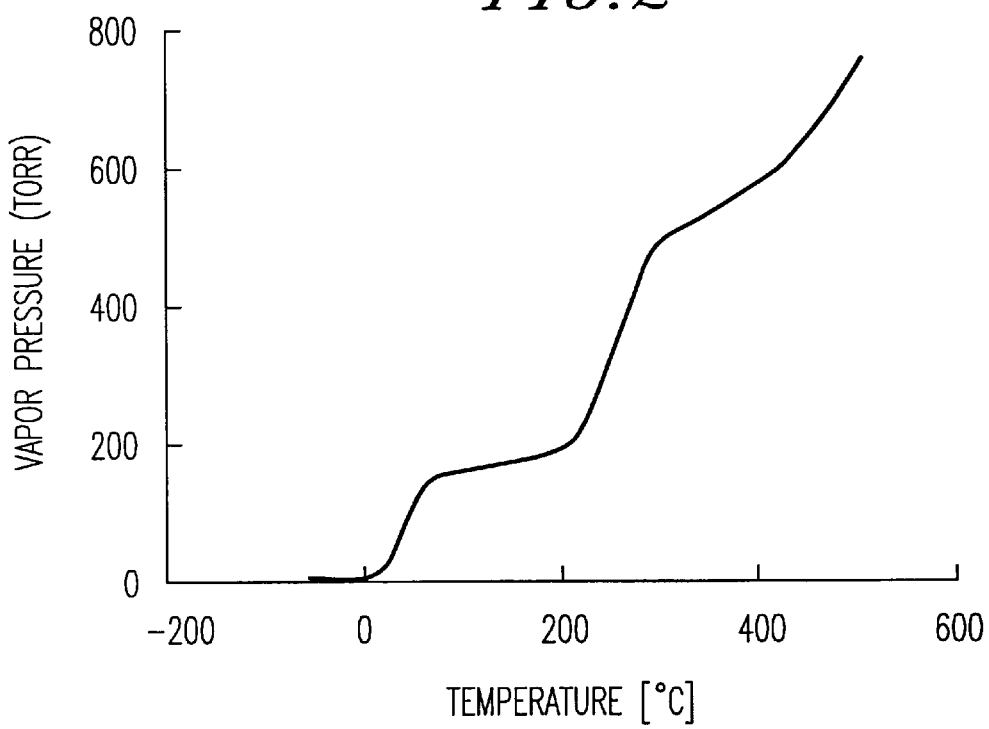
FIG. 2 shows the measured results of saturated vapor pressures of tert-butylhydrazine by a Bourdon saturated type vapor pressure measuring device.
Figure 3:
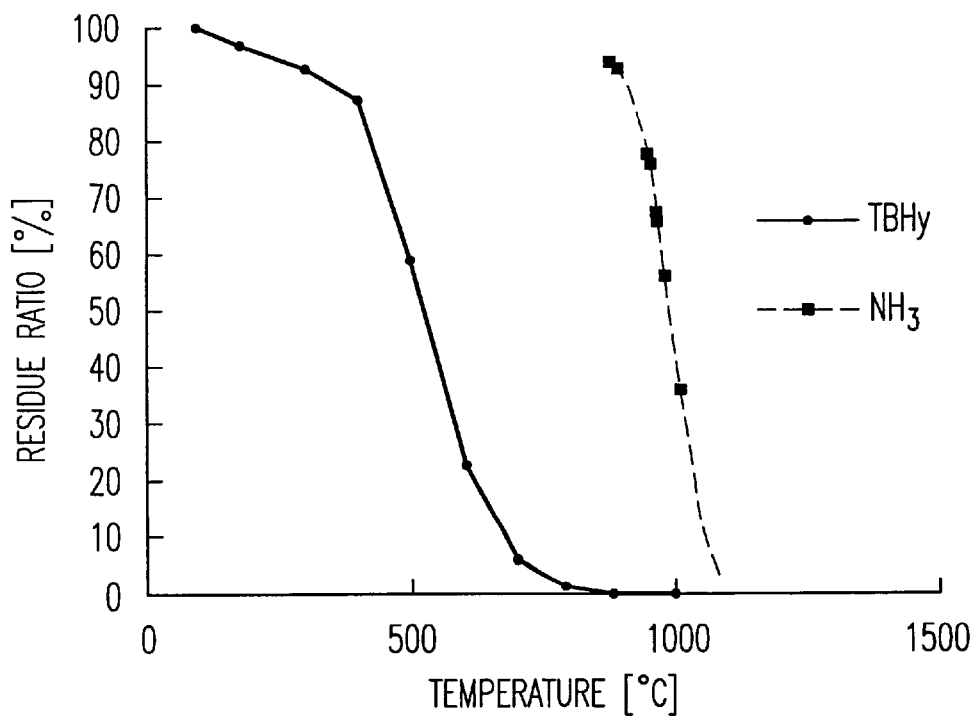
FIG. 3 shows the residue ratios of tert-butylhydrazine (TBHy) and ammonia ($NH_3$) with respect to temperatures.

1 Bubbler filled with tert-butylhydrazine
2 Bubbler filled with a liquid material
3 Bomb filled with a gaseous material
4 Thermostatic chamber
5 Mass flow controller
6 Reaction tube
7 Substrate
8 Suscepter
9 Conductance valve
10 Turbo-molecular pump
11 Rotary pump
12 Detoxifying apparatus
13 Carrier gas purifying equipment

DESCRIPTION OF THE PREFERRED EMBODIMENTS

Tert-butylhydrazine for use in the present invention is utilized in the manufacture of a semiconductor film, an insulating film, a metallic film or the like necessary for the preparation of a semiconductor device, and tert-butylhydrazine having an extremely high purity is required. Even tert-butylhydrazine which has been purified by distillation contains water, methyl alcohol and other impurities, and therefore it is desired to heighten its purity concretely up to a level of 99.999% or more by a specific technique. No particular restriction is put on the technique for purifying tert-butylhydrazine to the high level, but a purifying process of high-purity tert-butylhydrazine which can be used in the present invention will be exemplified as follows.

For example, high-purity tert-butylhydrazine which can be used in the present invention can be purified by bringing tert-butylhydrazine into contact with a synthetic zeolite adsorbent having a pore diameter of 3 to 4 Å in a vapor phase under a vapor pressure of tert-butylhydrazine alone or vapor pressures of both tert-butylhydrazine and an inert gas. For this purification, tert-butylhydrazine purified by distillation is usually used in which impurities such as water and alcohols are controlled to 1% or less.

The synthetic zeolite adsorbent having a pore diameter of 3 to 4 Å for use in the purification is a synthetic zeolite obtained by chemically replacing a part of sodium in a hydrous sodium salt of a synthetic crystalline aluminosilicate with potassium. This crystalline synthetic zeolite is characterized by having many pores therein which are substantially uniformed in a pore diameter range of 3 to 4 Å.

This kind of adsorbent is usually molded into spheres of 4 to 20 mesh or columns having a diameter of 1.5 to 4 mm and a length of 5 to 20 mm for the sake of an efficient utilization. Examples of the commercially available synthetic zeolite which can meet this condition include Molecular Sieves 3A and 4A (made by Union Carbide Co., Ltd. in USA and Union Showa Co., Ltd.), and Zeolums 3A and 4A (Toso Co., Ltd.).

When the above adsorbent is used, impurities such as water, methyl alcohol and other lower aliphatic alcohols can selectively be adsorbed without any adsorption of tert-butylhydrazine, whereby the impurities can be removed by the adsorption to low concentrations.

The synthetic zeolite is usually put into a purification column and then used as a fixed bed. A filling length of the adsorbent is usually in the range of 50 to 1500 mm. If the filling length is less than 50 mm, a removal ratio of water and the other impurities is likely to deteriorate, and on the other hand, if it is more than 1500 mm, a pressure loss is likely to increase. Prior to the use of the adsorbent, the adsorbent is activated at a temperature of about 200 to 350° C. while an inert gas is allowed to flow, and afterward, it is used for the purification of tert-butylhydrazine.

The feed of tert-butylhydrazine to a purification step can be carried out by (1) a method which comprises placing tert-butylhydrazine in a suitable container, directly heating the container from the outside or immersing the container in a thermostatic chamber to heat it up to a suitable temperature, and then feeding tert-butylhydrazine by the utilization of its vapor pressure under reduced pressure, or (2) a method which comprises associating the vapor of tert-butylhydrazine with an inert gas, and then feeding tert-butylhydrazine under reduced pressure, atmospheric pressure or increased pressure.

No particular restriction is put on the inert gas usable herein, so long as it is a gas which neither contaminates tert-butylhydrazine and nor has any chemical influence on tert-butylhydrazine, but in general, nitrogen, argon or helium can be used.

During the purification, the superficial velocity in a column (LV) of the vapor alone of tert-butylhydrazine or the gas containing the vapor of tert-butylhydrazine and the inert gas cannot be sweepingly decided, because it depends on operative conditions such as a concentration of water contained in fed tert-butylhydrazine, a temperature and a pressure. Nevertheless, the LV is usually in the range of about 0.1 to 200 cm/sec, preferably about 1 to 50 cm/sec.

A contact temperature of the gas of tert-butylhydrazine and the adsorbent may be ordinary temperature, but when the contact temperature is ordinary temperature, the vapor pressure of tert-butylhydrazine is low, which takes a long time for the purification, and when it is too high, an adsorption ability of the adsorbent is low. In view of these facts, the contact temperature is usually in the range of about 50 to 100° C. In any case, it is necessary to employ such a temperature and operative conditions that tert-butylhydrazine does not condense in the purification column and a pipe. During the purification, the pressure may be a reduced pressure in the case that the purification of tert-butylhydrazine is carried out by using tert-butylhydrazine singly under the vapor pressure of tert-butylhydrazine, but it is usually in the range of about 0.10 to 3 kg/cm$^2$abs.

The vapor of purified tert-butylhydrazine alone or the mixed gas of purified tert-butylhydrazine and the inert gas is fed to a condenser, in which the gas is condensed and then collected in the state of a liquid. The condenser may have the same structure as used in a usual chemical operation, and for example, a double pipe condenser can be used. Alternatively, in the case of a small scale, a collection container itself for tert-butylhydrazine can also be used as the condenser.

A temperature of the condenser cannot sweepingly be decided, because it depends on the operative conditions, but it is usually such a temperature or more that tert-butylhydrazine does not condense. Thus, the condensation is carried out at a temperature within the range of about −40 to 25° C.

Portions of an evaporator, the purification column, the condenser and the collection container for tert-butylhydrazine which come in contact with tert-butylhydrazine are preferably made of electropolished SUS 316 or SUS 316L.

On the other hand, as an organometallic compound, a metal halide or a metal hydride which can be used in the present invention, there can be used compounds which have heretofore been used for the manufacture of the nitride film or which are known. Examples of the organometallic compound include alkyl compounds of aluminum, gallium and indium, and alkylamine compounds of titanium, zirconium, tantalum, tungsten and silicon. Examples of the metal halide include fluorides, chlorides, bromides and iodides of titanium, zirconium, tantalum, tungsten, silicon and gallium. Examples of the metal hydride include hydrides of boron, silicon, tin, antimony and germanium. Above all, the alkyl compound in which three methyl groups or three ethyl groups are bonded to aluminum, gallium or indium can provide a grown layer having a high crystallinity and a nitride film having an excellent controllability in points of a growth rate, a mixed crystal composition, an impurity concentration and the like. In addition, this alkyl compound can be used in a chemical vapor growth method which can be applied to various material systems, and for this reason, the alkyl compound is most suitable as the material gas.

In addition, examples of a material for the substrate comprising the metal or the metal oxide which can be used in the present invention include silicon, silicon oxide, titanium, gallium arsenide and indium phosphide.

The preparation process of the nitride film according to the present invention can be applied to any of a high-temperature thermal CVD method of heating the substrate to excite a reaction material, a plasma CVD method of utilizing the energy of a plasma, a photo assisted CVD method of utilizing the light irradiation of an Hg light, a laser beam or the like, an MOCVD method of using an organometallic compound, and an MOMBE method of using an organometallic compound as a raw material and growing a semiconductor crystalline thin film on the substrate by a thermal decomposition reaction. Furthermore, the process for preparing the nitride film according to the present invention can be applied to any of conventionally known CVD film forming devices such as horizontal, vertical and barrel devices of a batch system, a device of a continuous system, and a single wafer processing system.

Next, one embodiment of the process for preparing the nitride film of the present invention will be described with reference to attached drawings, but a manufacturing apparatus for the practice of the present invention should not be limited by this embodiment.

FIG. 1 shows a vapor phase growth device. Tert-butylhydrazine which is the main component of a nitrogen source is put in a bubbler 1 made of a stainless steel, and tert-butylhydrazine is maintained at a constant temperature in a thermostatic chamber 4 to control a vapor pressure. An organometallic compound, a metal halide or a metal hydride, if being liquid at ordinary temperature, is put in a bubbler 2 maintained at a constant temperature in the thermostatic chamber, as in the case of tert-butylhydrazine, and if being gaseous at ordinary temperature, the compound which is put in a bomb 3 made of stainless steel is used. Examples of the liquid material which is put in the bubbler 2 include $(CH_3)_3Al$, $(C_2H_5)_3Al$, $(CH_3)_3Ga$, $(C_2H_5)_3Ga$, $(CH_3)_3In$, $(C_2H_5)_3In$, $Ti[N(CH_3)_2]_4$, $Ti[N(C_2H_5)_2]_4$, $Ta[N\{(CH_3)_2CH_2\}_2]_5$, $(iso-C_3H_7-C_5H_4)_2WH_2$, $Zr[N(CH_3)_2]_4$, $Al(CH_3)_2H$, $Si[N(CH_3)_2]_4$, $SiCl_4$, $SiHCl_3$ and $TiCl_4$. Examples of the gaseous material which can be used while put in the stainless steel bomb 3 include $WF_6$, $SiH_4$, $SiH_2Cl_2$ and $B_2H_6$. In addition, although not shown in FIG. 1, solid materials such as $Ta[N(CH_3)_2]_5$, $Ta[N(C_2H_5)_2]_5$, $TaCl_5$, $TaBr_5$, $W[N(CH_3)_2]_4$, $WCl_6$ and $ZrCl_4$ can also be used. Alternatively, tert-butylhydrazine alone which is put in the bubbler 1 can be used as the material gas, and the surface of the substrate can be nitrided, thereby preparing the nitride film thereon.

As a gas for the bubbling of the material and a carrier gas, an inert gas such as hydrogen, helium, nitrogen or argon can be used, but prior to use, this gas can before-hand be treated by an applicable purification device to remove water and impurities such as oxygen. The flow rates of these material gases can exactly be controlled by a mass flow controller 5. The respective material gases can be fed to a reaction tube 6 together with a large amount of the carrier gas through different pipes. The reaction tube in FIG. 1 is a hot wall type device, but a cold wall type device can also be used. The heating of a substrate 7 can be carried out by high frequency induction heating, and measurement and temperature control can be performed by a chromel-alumel thermocouple or the like inserted into a suscepter.

For the substrate 7, a material such as $Si/SiO_2$, SiC or $Al_2O_3$ (sapphire) can be used. When $Si/SiO_2$ is used for the substrate, the nitride film of, for example, TiN, TaN, WN or $Si_3N_4$ can be formed on the $SiO_2$ surface. The thus formed element can be utilized as an electrical or an electronic element such as a wiring substrate of a VLSI (a very large scale integrated circuit). Furthermore, when SiC or $Al_2O_3$ is used for the substrate, GaN, InN or AlN can be formed as the nitride film. The thus formed element can mainly be utilized as an electronic element such as a blue emitting element.

In the case of a low pressure CVD, the reaction tube can be sucked by a rotary pump 11, and the pressure in the reaction tube can be adjusted by, for example, a conductance valve 9. A material feed side can be maintained at ordinary temperature by the use of a needle valve or the like. During the manufacture of the nitride film, a large amount of a gas which cannot directly be released into the atmosphere is generated, and hence a detoxifying apparatus 12 should be installed.

In the case that the vapor phase growth device shown in FIG. 1 is used, a growth pressure, a growth temperature and a growth time for the nitride film can be suitably selected in consideration of the kind of nitride film, but in the present invention, usually, the growth pressure is in the range of 1 to 100 Torr, the growth temperature is in the range of 700 to 1100° C., and the growth time is in the range of 0.5 to 20 minutes.

Next, the present invention will be described in more detail in accordance with some examples.

EXAMPLE 1

[I] Purification of High-purity Tert-butylhydrazine

For the purification of tert-butylhydrazine, the following devices were used.

As an evaporator of tert-butylhydrazine, there was used an evaporator made of SUS 316L and having an internal volume of 2.2 liters in which a bubbling pipe for introducing purified nitrogen was inserted to a position close to the bottom thereof, a heating jacket was disposed around the outer periphery of the evaporator itself, and the inside surface thereof was subjected to an electrolytic polishing treatment.

In a purification column which was herein used, a tube made of SUS 316L and having an inner diameter of 28.4 mm, a length of 450 mm and an electropolished inside surface was filled with 190 ml of pellet-like molecular sieves 3A made by Union Showa Co., Ltd. and having a diameter of 1.6 mm and a length of 3 to 5 mm. This purification column was heated up to 350° C., and nitrogen gas was simultaneously fed thereto for 5 hours at a flow rate of 5 liters/min to activate the molecular sieves. After completion of the activation, the purification column was cooled to ordinary temperature.

A cooler which was herein used was a double pipe type made of SUS 316L and subjected to an electrolytic polishing treatment, and this cooler was constituted so that a refrigerant might circulate through the outside portion thereof and the vapor of purified tert-butylhydrazine might come in contact with the inside surface thereof. Furthermore, a pipe extending from the evaporator to the purification column is constituted so as to be heated by a ribbon heater and to keep the heat.

The purification was carried out as follows. That is to say, 1.2 liters of tert-butylhydrazine was placed in the evaporator. This tert-butylhydrazine contained 0.09% of water and 0.2% of methyl alcohol and other lower aliphatic alcohols in total. Purified nitrogen gas was blown thereinto at a flow rate of 0.5 liter per minute, while this tert-butylhydrazine was heated up to 80° C., and the nitrogen gas saturated with tert-butylhydrazine (tert-butylhydrazine concentration= about 8.8 vol %) was fed to the purification column. This purification column was heated up to 90° C., and in the cooler, the refrigerant was circulated so as to keep up −10° C., whereby purified tert-butylhydrazine was liquefied and collected. During this liquefaction and collection step, the pipe extending from the evaporator to the purification column was heated up to and maintained at 90° C.

The purified tert-butylhydrazine obtained in this manner was analyzed by a gas chromatograph equipped with an optical ionization type detector, and as result, a moisture content in the purified tert-butylhydrazine was 1 ppm or less, and the total amount of methyl alcohol and the other impurities was 1.7 ppm or less.

[II] Preparation of a Nitride Film

Tert-butylhydrazine purified in the above-mentioned manner and commercially available trimethylgallium $[(CH_3)_3Ga]$ having a purity of 99.9999% were used as material gases and a vapor phase growth device shown in FIG. 1 was also used, and a GaN film was deposited on a sapphire substrate by the following procedure.

(1) The disc sapphire substrate having a diameter of 2 inches was washed with trichloroethylene, acetone and methanol for about 10 minutes, respectively, overflowed with pure water for 10 minutes, and then dried by nitrogen blow. Afterward, the surface of the sapphire was etched with a reagent of $H_3PO_4:H_2SO_4=1:3$ (weight ratio), overflowed with pure water for 10 minutes, and then dried by nitrogen blow.

(2) A susceptor was baked at 1150° C. for 1 hour in a hydrogen atmosphere, and the sapphire substrate pretreated in the above step (1) was then fixed on the susceptor. Afterward, this susceptor was disposed in a reaction tube, and vacuum exhaust was then carried out. In succession, hydrogen which was a carrier gas was introduced into the reaction tube for 1 hour to purge it.

(3) Bubblers made of SUS 316 and having an electro-polished inside surface were filled with the above-mentioned materials, respectively, and tert-butylhydrazine was kept at 60° C. and trimethylgallium was kept at 30° C. Next, flow rates of the respective materials were controlled by a mass flow controller to regulate pressures so that hydrogen gas might be fed at 500 ml/min to the bubbler filled with tert-butylhydrazine and the hydrogen gas might be fed at 10 ml/min to the bubbler filled with trimethylgallium.

(4) Tert-butylhydrazine was allowed to flow through the reaction tube and the temperature of the suscepter was adjusted to 1100° C. to nitride the surface of the substrate.

(5) After the temperature of the suscepter was lowered to 700° C., tert-butylhydrazine and trimethylgallium were allowed to flow through the reaction tube together with the hydrogen gas, whereby the growth of a GaN film was begun. In this case, a growth pressure was 60 Torr, a growth temperature was maintained at 700° C., and a growth time was 30 minutes.

(6) After completion of the growth, the temperature was raised up to 1100° C. and maintained at this temperature for 10 minutes, while the hydrogen gas alone was allowed to flow through the reaction tube. Afterward, the reaction tube was cooled, keeping up the state where the hydrogen gas alone was allowed to flow through the reaction tube. After the temperature of the reaction tube became ordinary temperature, the substrate was taken out.

The surface of the substrate was analyzed by an energy dispersion type X-ray analyzer (EDAX), and as a result, the presence of a GaN film was observed. Further-more, it was apparent from the results of the gravimetric determination of the GaN film that a film formation efficiency was 90%.

EXAMPLE 2

Tert-butylhydrazine purified in the above-mentioned manner and commercially available tetrakisdimethylaminotitanium [Ti{N(CH$_3$)$_2$}$_4$] having a purity of 99.995% were used as material gases and a vapor phase growth device shown in FIG. 1 was also used, and a TiN film was deposited on an Si/SiO$_2$ substrate by the following procedure.

(1) The disc single crystal silicon substrate having a diameter of 4 inches was washed with trichloroethylene, acetone and methanol for about 10 minutes, respectively, overflowed with pure water for 10 minutes, and then dried by nitrogen blow. Afterward, the surface of the SiO$_2$ was etched with a reagent of H$_3$PO$_4$:H$_2$SO$_4$=1:3 (weight ratio), overflowed with pure water for 10 minutes, and then dried by nitrogen blow.

(2) A suscepter was baked at 500° C. for 1 hour in a nitrogen atmosphere, and the Si/SiO$_2$ substrate pretreated in the above step (1) was then fixed on the suscepter so that the Si/SiO$_2$ surface might be an upper side. Afterward, this suscepter was disposed in a reaction tube, and vacuum exhaust was then carried out. In succession, nitrogen which was a carrier gas was introduced into the reaction tube for 1 hour to purge it.

(3) Bubblers made of SUS 316 and having an electropolished inside surface were filled with the above-mentioned materials, respectively, and tert-butylhydrazine was kept at 40° C. and tetrakisdimethylaminotitanium was kept at 60° C. Next, flow rates of the respective materials were controlled by a mass flow controller to regulate pressures so that nitrogen gas might be fed at 500 ml/min to each bubbler.

(4) After the temperature of the suscepter was raised up to 400° C., tert-butylhydrazine and tetrakisdimethylaminotitanium were allowed to flow through the reaction tube together with the nitrogen gas, whereby the growth of a TiN film was begun. In this case, a growth pressure was 2.0 Torr, a growth temperature was maintained at 400° C., and a growth time was 30 minutes.

(5) After completion of the growth, the temperature of the reaction tube was raised up to 500° C. and maintained at this temperature for 10 minutes, while the nitrogen gas alone was allowed to flow through the reaction tube. Afterward, the reaction tube was cooled, keeping up the state where the nitrogen gas alone was allowed to flow through the reaction tube. After the temperature of the reaction tube became ordinary temperature, the substrate was taken out.

The surface of the substrate was analyzed by an EDAX, and as a result, the presence of TiN film was observed and according to surface observation by an SEM (a scanning type electronic microscope), the uniform surface was observed. Furthermore, it was apparent from the results of the gravimetric determination of the TiN film that a film formation efficiency was 92%.

In a process for preparing a nitride film of the present invention, tert-butylhydrazine which is less toxic, has a sufficiently high vapor pressure, and can decompose at a relatively low temperature is used as the main component of a nitrogen source. Therefore, the handling operation of a material gas can safely be carried out, and in addition, the high quality of a thin film, the drop of a growth temperature and the improvement of a growth rate can be realized.

What is claimed is:

1. A process for preparing a nitride film by a chemical vapor deposition method which comprises the step of reacting a material gas including tert-butylhydrazine as the main component of a nitrogen source with a material gas of an organometallic compound, a metal halide or a metal hydride to deposit the nitride film on a substrate.

2. The process for preparing the nitride film according to claim 1, wherein the tert-butylhydrazine is purified tert-butylhydrazine having a purity of 99.999% or more.

3. The process for preparing the nitride film according to claim 2, wherein the purified tert-butylhydrazine is purified by bringing tert-butylhydrazine into contact with a synthetic zeolite adsorbent having a pore diameter of 3 to 4 Å in a vapor phase under a vapor pressure of tert-butylhydrazine alone or vapor pressures of both tert-butylhydrazine and an inert gas.

4. The process for preparing the nitride film according to claim 1, wherein the organometallic compound is an alkyl compound of aluminum, gallium or indium, or an alkylamine compound of titanium, zirconium, tantalum, tungsten or silicon.

5. The process for preparing the nitride film according to claim 4, wherein said organometallic compound is trimethylgallium.

6. The process for preparing the nitride film according to claim 4, wherein said organometallic compound is tetrakisdimethylaminotitanium.

7. The process for preparing the nitride film according to claim 1, wherein the metal halide is a fluoride, a chloride, a bromide or an iodide of titanium, zirconium, tantalum, tungsten, silicon or gallium.

8. The process for preparing the nitride film according to claim 1, wherein the metal hydride is a hydride of boron, silicon, tin, antimony or germanium.

9. The process for preparing the nitride film according to claim 1, wherein the following conditions are used:

growth pressure 1 to 100 Torr growth temperature 700 to 1,100° C.

growth time 0.5 to 20 min.

10. A process for preparing a nitride film which comprises the step of nitriding the surface of a substrate comprising a metal or a metal oxide by the use of a material gas including tert-butylhydrazine as the main component of a nitrogen source.

* * * * *